(12) United States Patent
Kawakubo et al.

(10) Patent No.: US 6,870,445 B2
(45) Date of Patent: Mar. 22, 2005

(54) THIN FILM BULK ACOUSTIC WAVE RESONATOR (75) Inventors: Takashi Kawakubo, Kanagawa-ken (JP); Kenya Sano, Kanagawa-ken (JP); Ryoichi Ohara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 10/397,176

(22) Filed: Mar. 27, 2003

(65) Prior Publication Data

US 2004/0012463 A1 Jan. 22, 2004

(30) Foreign Application Priority Data

Mar. 28, 2002 (JP) ........................ 2002-091593

(51) Int. Cl.⁷ ............. H03H 9/17; H03H 9/205; H03H 9/54; H03H 9/56
(52) U.S. Cl. ............. 333/187; 333/189; 333/191; 310/324; 310/349
(58) Field of Search ................ 333/186–192; 310/324, 349

(56) References Cited

U.S. PATENT DOCUMENTS

| | | | | |
|---|---|---|---|---|
| 4,890,370 A | * | 1/1990 | Fukuda et al. ................ 216/2 |
| 5,233,259 A | * | 8/1993 | Krishnaswamy et al. ... 310/324 |
| 5,872,493 A | * | 2/1999 | Ella ........................... 333/191 |
| 6,047,590 A | * | 4/2000 | Namerikawa et al. ..... 73/54.24 |
| 6,495,945 B2 | * | 12/2002 | Yamaguchi et al. ........ 310/324 |
| 6,741,147 B2 | * | 5/2004 | Harris ........................ 333/188 |

FOREIGN PATENT DOCUMENTS

| | | | |
|---|---|---|---|
| JP | 2000-012858 | | 1/2000 |
| JP | 2001-168674 | * | 6/2001 |

* cited by examiner

Primary Examiner—Barbara Summons
(74) Attorney, Agent, or Firm—Oblon, Spivak, McClelland, Maier & Neustadt, P.C.

(57) ABSTRACT

The present invention is intended to provide a thin film bulk acoustic wave resonator, which has a resonant excitation portion free from damage caused by etching, a high electromechanical coupling coefficient $k_t^2$ and a high quality coefficient Q value, and to provide a thin film bulk acoustic wave resonator having a plurality of different resonant frequencies, which can be formed on the same substrate without increasing number of lithography process.

An internal cavity is provided in a semiconductor or insulative substrate such as crystal silicon. The thin film bulk acoustic wave resonator has a layered member comprising a first electrode film, a piezoelectric film and a second electrode film on a thin wall of e.g. single crystal over the internal cavity.

9 Claims, 8 Drawing Sheets

THIN FILM BULK ACOUSTIC WAVE RESONATOR

CROSS-REFERENCE TO RELATED APPLICATIONS

This application is based upon and claims the benefit of priority from the prior Japanese Patent Application No. 2002-91593, filed on Mar. 28, 2002; the entire contents of which are incorporated herein by reference.

BACKGROUND OF THE INVENTION

1. Field of the invention

The present invention relates to a thin film bulk acoustic wave resonator.

2. Related Art

The thin film bulk acoustic wave resonator utilizing the thickness longitudinal resonance of piezoelectric film is called a FBAR (Film Bulk Acoustic Resonator) or a BAW (Bulk Acoustic Wave) element, and has a good prospect on the application to RF filters and voltage controlled oscillators for mobile communication because dimension thereof is very small and a high excitation efficiency and sharp resonant characteristics can be obtained in a zone higher than GHz band.

In the thin film bulk acoustic wave resonator, resonant frequency thereof is determined by the acoustic velocity and the thickness of the piezoelectric film. Usually, the thickness of the piezoelectric film of 1 $\mu$m to 2 $\mu$m corresponds to 2 GHz, and the thickness of 0.4 $\mu$m to 0.8 $\mu$m corresponds to 5 GHz, and furthermore raising of the frequency up to several ten GHz is possible.

Performance of the thin film bulk acoustic wave resonator can be represented by the electromechanical coupling coefficient $k_t^2$ and the quality coefficient Q value.

The greater the electromechanical coupling coefficient $k_t^2$ becomes, the wider the bandwidth of the RF filter or the bandwidth of the voltage controlled resonator can be made. It is important that the resonator should be prepared by employing the piezoelectric crystal film having the high intrinsic electromechanical coupling coefficient $k_t^2$ and moreover aligning the polarization axis of the piezoelectric film crystal to the direction of the thickness of the film, in order to raise the electromechanical coupling coefficient $k_t^2$.

The quality coefficient Q value relates to insertion loss when the RF filter is formed, and to purity of the oscillation of the voltage controlled oscillator. Because the oscillation relates to various phenomena that will absorb elastic waves, a large value of the quality coefficient Q can be obtained by improving purity of the piezoelectric film crystal, or aligning the crystal orientation, or using the piezoelectric film with the aligned polarization direction.

Figure 10A:
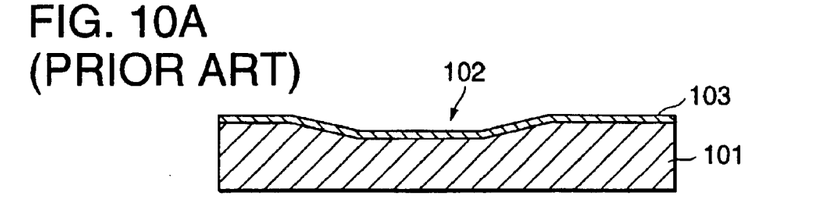
FIGS. 10A to 10E are cross sections explaining the fabrication process of a conventional resonator.

Referring to FIGS. 10A to 1E, a structure and a fabricating method of a typical thin film bulk acoustic wave resonator of conventional art will be explained.

As shown in FIG. 10A, a recess 102 is formed on a silicon substrate 101 by anisotropic etching. At this moment, a naturally oxidized film 103 is formed on the silicon substrate.

Figure 10B:
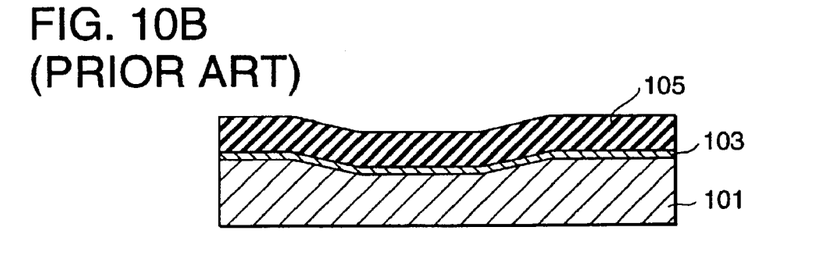

Then, as shown in FIG. 10B, a sacrificial layer 105 (for example boron or phosphorus doped silicate glass, BPSG BoroPhosphoSilicate Glass), which is easy to be etched, is formed on the silicon substrate 101.

Figure 10C:
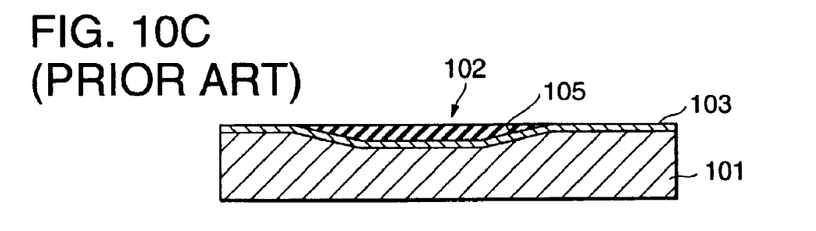

Thereafter, as shown in FIG. 10C, the surface of the sacrificial layer 105 is polished until the surface of the silicon substrate 101 appears at the portion other than the recess 102 of silicon.

Figure 10D:
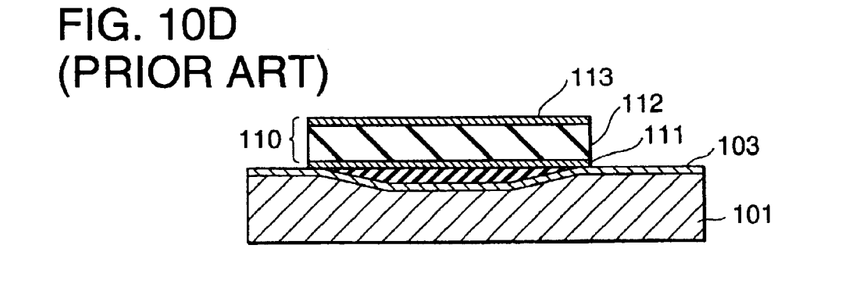

Next, as shown in FIG. 10D, a lower electrode 111, a piezoelectric film 112 and an upper electrode 113 are deposited in order on the sacrificial layer 105. The layered structure 110 comprised of the lower electrode 111, the piezoelectric film 112 and the upper electrode 113 becomes a piezoelectric excitation portion.

Figure 10E:
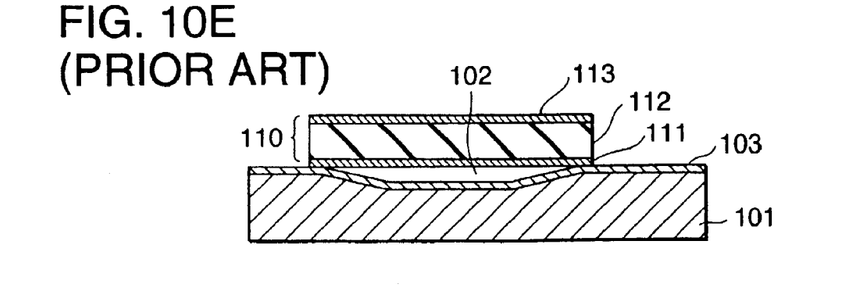

Then, as shown in FIG. 10E, the lower electrode 111, the piezoelectric film 112 and the upper electrode 113 are drilled (not shown) up to the sacrificial layer 105, and then the sacrificial layer 105 is removed by selective etching, so as to expose the recess 102.

The piezoelectric resonator comes to completion by such processes. However, in this method, the sacrificial layer 105 must be removed after the layered structure of the lower electrode 111, the piezoelectric film 112 and the upper electrode 113, which is the piezoelectric excitation portion 110, is formed.

There is a problem that the piezoelectric excitation portion 110 is damaged because this etching usually requires long hours of treatment with strong acid or strong alkali, etc. Especially, following problems will occur, i.e. crystallinity of the piezoelectric film 112 is spoiled; the electromechanical coupling coefficient $k_t^2$ gets decreased; and the quality coefficient Q value deteriorates remarkably.

When the thin film bulk acoustic wave resonator is formed in an IC in which transistors, etc. have been fabricated in advance, there is a possibility of damaging the transistors, etc.

Besides, the thin film bulk acoustic wave resonator corresponding to multi bands, which has a plurality of thin film bulk acoustic wave resonators having different resonant frequencies formed on the same substrate, has been expected for the future mobile communication terminal.

For example, in the case of a cellular phone corresponding to multi bands, RF filters and voltage controlled oscillators corresponding to respective frequencies of band are necessary.

When an RF circuit using a channel filter is employed, RF filters with different frequencies in accordance with the channel number are required, even if the cellular phone is a single band type.

For example, because the band width of 60 MHz is divided into twelve channels of 5 MHz for W-CDMA (Wide-band Code Division Multiple Access) system, at least 12 kinds of narrow band thin film bulk acoustic wave resonators, each of which has a frequency different from that of the neighboring one by 5 MHz, are necessary.

For the structure of the conventional thin film bulk acoustic wave resonator explained in FIGS. 10A to 10E, it is necessary that the thin film bulk acoustic wave resonators with different thickness are formed on the same substrate by regulating the thickness of the piezoelectric film or the thickness of the electrode in order to correspond to each frequency. The reason is that the resonant frequency band can be changed by the thickness of the piezoelectric film or the thickness of the electrode.

However, to form the piezoelectric resonators, etc. with different thickness, number of lithography process for forming them in each thickness gets increased. This is a serious problem.

As mentioned above, the conventional thin film bulk acoustic wave resonator has a problem that the electromechanical coupling coefficient $k_t^2$ and the quality coefficient Q value are remarkably decreased because the piezoelectric film is damaged by etching process for forming the cavity.

In addition, the conventional thin film bulk acoustic wave resonator has another problem that number of lithography process for forming piezoelectric films of different thickness gets increased in order to correspond to the multi bands.

The present invention is intended to provide a thin film bulk acoustic wave resonator, which has a resonant excitation portion free from damage caused by etching, a high electromechanical coupling coefficient $k_t^2$ and a high quality coefficient Q value, in the light of the problems mentioned above.

The present invention is also intended to provide a thin film bulk acoustic wave resonator having a plurality of different resonant frequencies, which can be formed on the same substrate without increasing number of lithography process.

BRIEF SUMMARY OF THE INVENTION

To accomplish the above subject, an aspect of the invention is a thin film bulk acoustic wave resonator comprising:

a substrate of semiconductor or insulator, having one major surface and an internal cavity formed adjacent to the major surface, wherein a thin wall of the same material as the substrate, surrounding a part of the internal cavity, is positioned on the major surface of the substrate;

a first electrode film formed on the major surface side of the thin wall;

a piezoelectric film formed on the first electrode film; and a second electrode film formed on the piezoelectric film, the thin wall, the first electrode film, the piezoelectric film and the second electrode film constructing a resonator.

Here, the first electrode film, the piezoelectric film and the second electrode film are preferably lengthened up to the major surface located in the outside of the thin wall.

Additionally, the substrate has a recessed surface on the major surface, and the thin wall is located on the recessed surface, and further a layered structure comprising the first electrode, the piezoelectric film and the second electrode is formed at a position lower than the top surface of the major surface.

Moreover, an aperture communicating with the internal cavity can be formed in a part of the thin wall.

Furthermore, thickness of the thin wall is preferably equal to or smaller than 10 $\mu$m.

In addition, thickness of the layered structure comprising the first electrode film, the piezoelectric film and the second electrode film is preferably equal to or smaller than 10 $\mu$m.

Another aspect of the present invention is a thin film bulk acoustic wave resonator comprising:

a substrate of semiconductor or insulator having a plurality of internal cavities formed along one major surface, and thin walls located between the major surface and the respective internal cavities, wherein thickness of at least one of the thin walls is different from thickness of the other walls; and resonators having layered resonant films, each of which comprises a first electrode film, a piezoelectric film and a second electrode film, deposited on the respective thin walls, constructing the resonators in cooperation with the thin walls, wherein a zone of resonant frequency varies in accordance with the thickness of the thin walls.

Moreover, the substrate is preferably a silicon substrate.

Furthermore, the substrate is preferably a glass substrate.

Additionally, the first electrode film, the piezoelectric film and the second electrode film are epitaxial growth films.

BRIEF DESCRIPTION OF THE DRAWINGS

FIGS. 4A to 4F are diagrams explaining the fabrication process of the embodiment 1 of the invention, wherein

DETAILED DESCRIPTION OF THE INVENTION

Embodiments of the present invention will be hereinafter explained in detail referring to the drawings. However the invention is not limited to the embodiments described below, but any artifice can be utilized.

(Embodiment 1)

Figure 1:
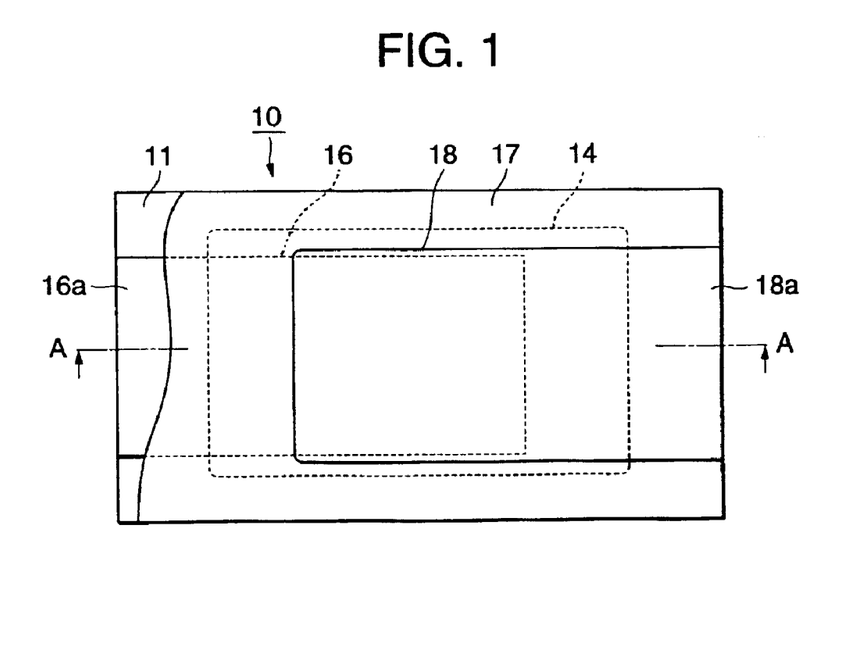
FIG. 1 is a top view of the thin film bulk acoustic wave resonator relating to the embodiment 1 of the invention.
Figure 2:
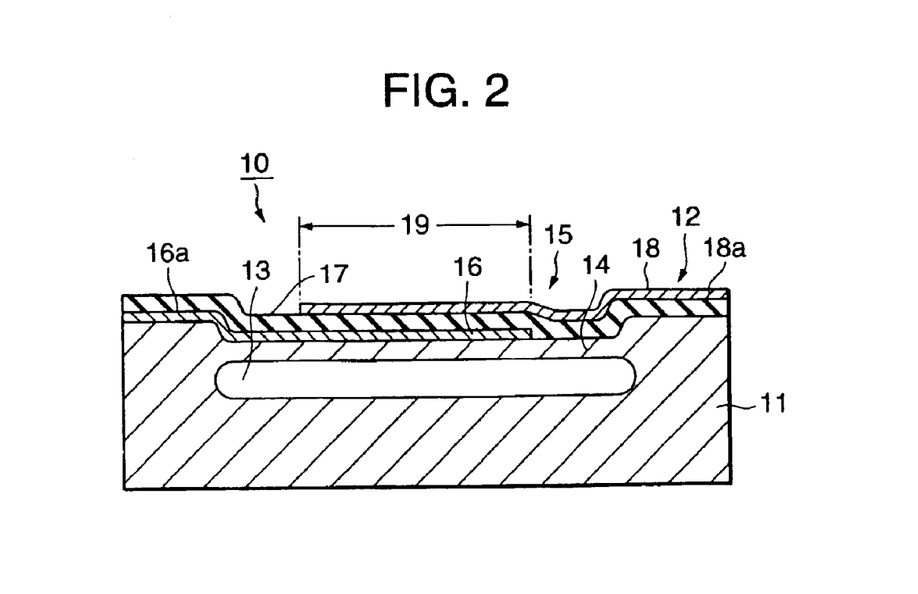
FIG. 2 is a cross section taken along the line A—A of FIG. 1 and seen from the direction of the arrow.

FIG. 1 and FIG. 2 show a thin film bulk acoustic wave resonator 10 of the embodiment 1. FIG. 1 is a top view thereof, and FIG. 2 is a cross section taken along the line A—A in FIG. 1.

A semiconductor substrate 11 of silicon has an internal cavity 13 elongated flatly adjacent to one major surface 12 thereof. The internal cavity 13 is isolated from the major surface 12 buried in the substrate by a thin wall 14 and positioned at the major surface side of the substrate. In other words, the thin wall 14 is a part of the substrate 11, formed with the same material as the substrate, and surrounds a part of the cavity 13.

The major surface 12 has a recessed portion 15 formed on the region corresponding to the cavity. On the thin wall 14 positioned at the recessed portion 15, a first electrode film 16 of metal such as Pt, a piezoelectric film 17, e.g. AlN piezoelectric material or barium titanate ferroelectric material, and a second electrode film 18 of metal such as Pt (platinum) are deposited in this order so as to form a layered member 19.

The first electrode film 16, the piezoelectric film 17 and the second electrode film 18 are lengthened on the major surface located outside of the thin wall 14.

In this embodiment, the thickness of the thin wall is for example 0.8 $\mu$m and the area thereof is 50 $\mu$m×50 $\mu$m; the thickness of the piezoelectric film 17 is 0.6 μm; the thickness of the first electrode film 16 and the second electrode film 18 is 100 nm; and the area of the layered member 19 is 30 μm×30 μm.

A lengthened portion 16a of the first electrode film 16 and a lengthened portion 18a of the second electrode film 18 become nodes or terminals to which a voltage is applied.

Resonant mode is a vibration in the direction of the thickness thereof, and the thin wall 14 and the layered member 19 vibrate integrally. The thickness of the thin wall 14 as well as the layered member affects the vibration.

Then, referring to FIG. 3 and FIG. 4, fabrication method of this embodiment will be explained.

Figure 3A:
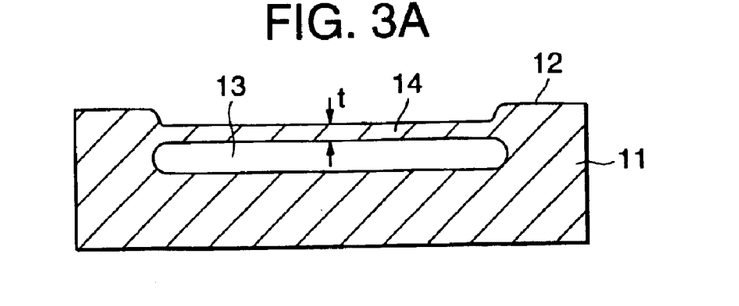
FIGS. 3A to 3D are cross sections explaining the fabrication process of the thin film bulk acoustic wave resonator relating to the embodiment 1 of the invention.

First of all, as shown in FIG. 3A, the single crystal silicon substrate 11 having the layer-like cavity 13 therein adjacent to the major surface 12 is prepared. In this case, the thickness t of the thin wall portion of the silicon substrate 11 positioned over the internal cavity 13 is to be 0.8 μm. The single crystal silicon substrate 11 is insulative. The thin wall 14 of the single crystal silicon shows (111) face. The thin wall 14 is formed at the recessed portion 15 of the major surface 12. Fabrication method of the single crystal silicon substrate 11 having such cavity 12 will be described later by referring to FIG. 4.

Figure 3B:
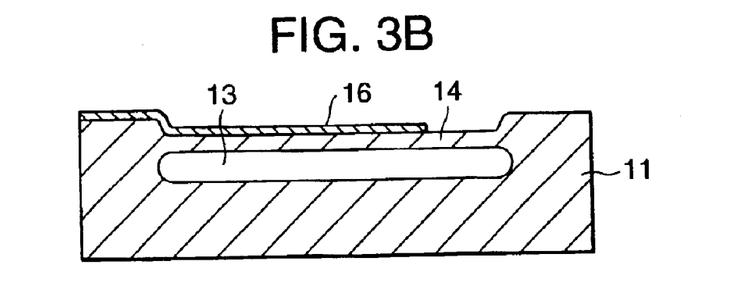

Then, as shown in FIG. 3B, a barrier layer of such as TiN (not shown) is formed on the thin wall 14 of the silicon substrate 11 by RF magnetron sputter method at the substrate temperature of 600 degrees Celsius, and an iridium (Ir) film oriented to (111) orientation is deposited thereon in the direction of the thickness thereof by epitaxial growth. The thickness of the iridium film is 100 nm. Subsequently, the iridium film is patterned by lithography and reactive ion etching (RIE) so as to form the first electrode film 16.

Figure 3C:
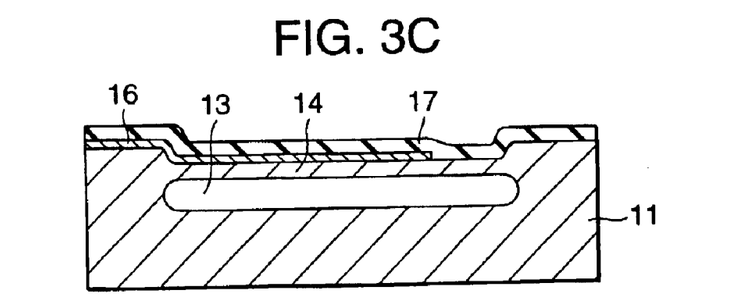

Next, as shown in FIG. 3C, the piezoelectric film 17 of aluminum nitride (AlN) oriented to (0001) orientation in the direction of the thickness thereof is deposited by epitaxial growth by the aid of RF magnetron sputter method at the substrate temperature of 600 degrees Celsius. The thickness of the piezoelectric film 17 is 0.6 μm.

Figure 3D:
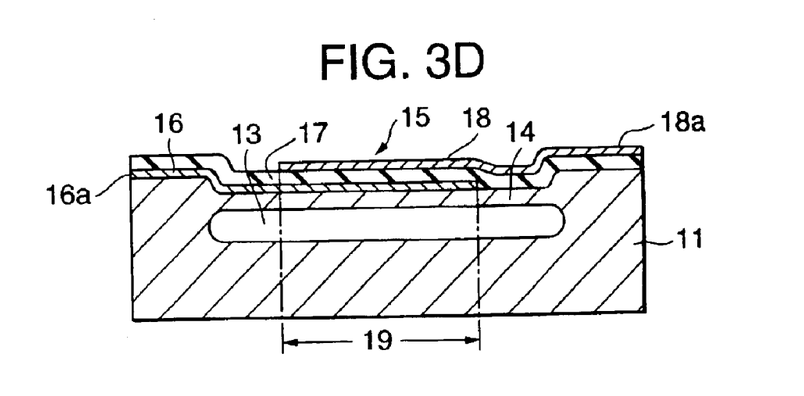

Subsequently, as shown in FIG. 3D, a platinum (Pt) film is deposited by epitaxial growth by the aid of RF magnetron sputter method. The thickness of the platinum film is 100 nm. Then, the second electrode film 18 is formed by patterning the platinum film with the aid of lithography and RIE. Thus the thin film bulk acoustic wave resonator having a resonant portion of the layered member 19 was accomplished over the cavity 13 of the silicon substrate 11. The layered member 19 becomes the piezoelectric excitation portion.

By measuring frequency characteristics of the thin film bulk acoustic wave resonator fabricated as mentioned above, it was confirmed that this thin film bulk acoustic wave resonator had excellent characteristics: i.e. the resonant frequency was 2.1 GHz; the electromechanical coupling coefficient was 5.5%; and the quality coefficient Q was 1700.

As the resonant portion includes the thickness t of the thin wall of the substrate, the frequency band can be regulated by adjusting the thickness of this portion. Therefore, the thickness t of the thin wall on the cavity 13 is preferably equal to or smaller than 10 μm in order to realize a desirable GHz band.

The electrodes and the piezoelectric film can be prepared with the aid of epitaxial growth by employing a single crystal semiconductor as the substrate.

In this embodiment, the layered structure comprising the first electrode film 16, the piezoelectric film 17 and the second electrode film 18 is formed on the single crystal semiconductor layer of the thin wall 14 existing over the flat cavity 13 formed in the substrate as a base member, without using selective etching of the sacrificial layer, which has been conventionally put to practical use. Therefore, a high electromechanical coupling coefficient and a high quality coefficient can be realized because damage of the driving portion due to selective etching does not take place.

In the resonator of this embodiment, the condition is that the thickness t of the thin wall and the sum of the thickness of the first electrode film 16, the piezoelectric film 17 and the second electrode film 18 are n times of a half of the oscillation wavelength (n is an order). In general, it is desirable that utilization with at most the third order resonance, or the fundamental (the primary order) resonance if possible, is carried out because the electromechanical coupling coefficient decreases when the order of resonance becomes high.

As the rate of the thickness of the piezoelectric film 17 to the total thickness of the whole films decreases, the electromechanical coupling coefficient decreases moderately. Consequently, utilization with the rate of film thickness equal to or greater than 0.5 is desirable when it is used for wide band filters or wide band oscillators. If it is used for narrow band filters or narrow band oscillators, utilization with the rate equal to or greater than 0.05 is desirable.

With regard to the quality coefficient Q of the resonator, since the quality coefficient of single crystal silicon is high (about 5000), any problems do not occur because the more the rate of the thickness of the silicon layer existing on the surface of the substrate over the internal cavity 13, i.e. the rate of the thickness of the thin wall 14 increases, the more the quality coefficient Q value improves.

Then, referring to FIG. 4, fabrication method of the single crystal silicon substrate inside which the flat layer-like cavity is located will be explained.

Figure 4A:
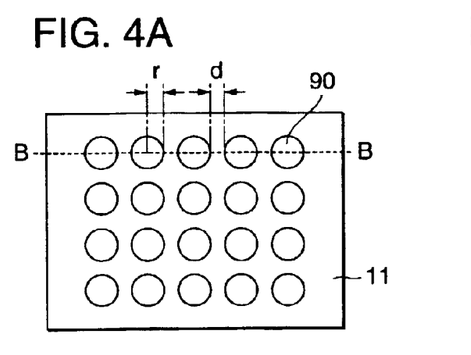
FIG. 4A is a top view.
Figure 4B:
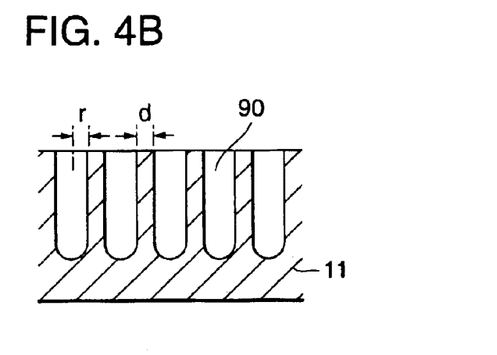
FIG. 4B is a cross section of FIG. 4A taken along the line B—B.

Firstly, cylindrical trenches 90 of a radius r are thickly formed at an interval d on the silicon substrate 11 by lithography and reactive ion etching as shown in FIG. 4A and FIG. 4B.

Figure 4C:
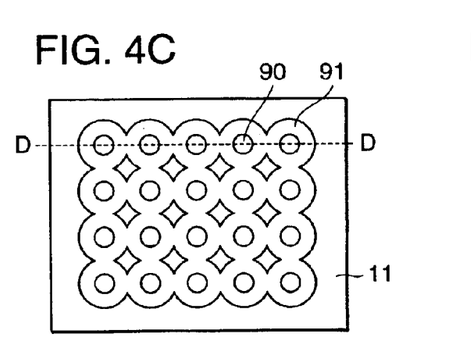
FIG. 4C is a top view.
Figure 4D:
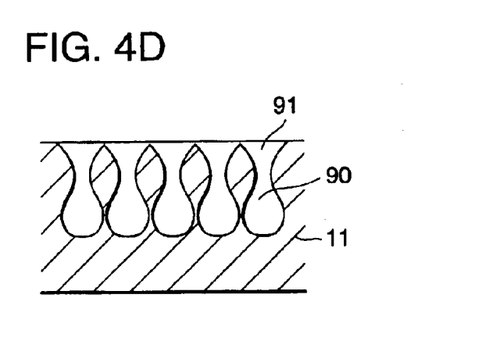
FIG. 4D is a cross section of FIG. 4C taken along the line D—D.

Subsequently, as shown in FIG. 4C and FIG. 4D, the trenches 90 are going to curl themselves up spherically in the silicon substrate 11 after reflow is carried out in high temperature hydrogen atmosphere, and then apertures 91 thereof are expanded.

Figure 4E:
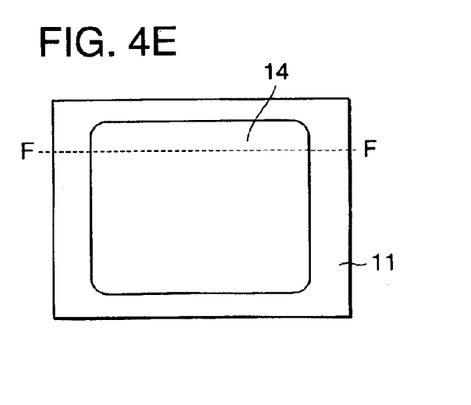
FIG. 4E is a top view.
Figure 4F:
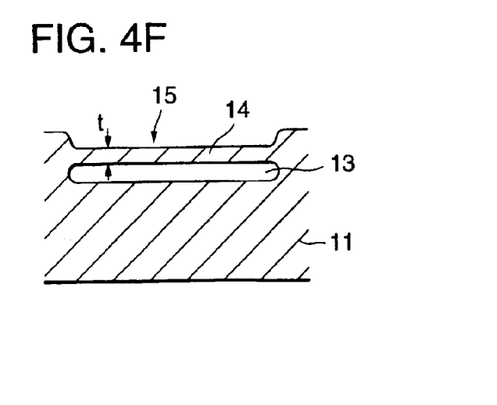
FIG. 4F is a cross section of FIG. EE taken along the line F—F.

Finally, the trenches are connected together in the lateral direction, to form the thin wall 14 and the cavity 13, and also the recessed portion 15 is formed on the surface, as shown in FIG. 4E and FIG. 4F. The single crystal silicon substrate 11 having the cavity 13 of FIG. 3A was formed by the aid of this method.

The thickness of the internal cavity 13 and the thickness of the thin wall 14 over the internal cavity 13 can be controlled by the diameter, the depth and the neighboring distance of the trenches. A plurality of the cavities can also be formed.

The thickness t of the thin wall 14 formed among a plurality of the cavities (including 'among semi-cavities on the surface as shown in FIG. 4A and cavities thereunder') is presented as follows, when r is the radius of the trench, and d is the interval thereof:

$$t = 27.9 r^3 / d^2 \qquad \text{equation (1).}$$

Therefore, the thickness t is determined solely by the radius r and the interval d of the trench, and does not depend on the depth of the trench. Accordingly, since the thickness t of the thin wall is determined by only lithography condition, a silicon layer with a certain thickness can be formed, regardless of process conditions such as etching rate.

The method possesses an excellent advantage that a single crystal silicon thin wall with a wide range of thickness can be formed by only one process, as seen by the equation (1).

When a piezoelectric film of hexagonal system such as AlN or ZnO is employed as the piezoelectric film, a single crystal silicon thin wall with (111) face can be used as a base member.

In addition, ferroelectric material of perovskite crystal system such as PZT(Pb(Zr,Ti)O$_3$) or BaTiO$_3$ can be used as the piezoelectric film. In this case, a single crystal silicon layer with (100) face can be put to practical use as the thin wall.

Figure 5:
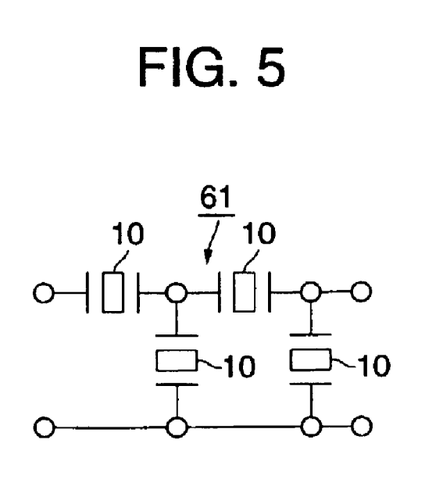
FIG. 5 is a circuit diagram where the thin film bulk acoustic wave resonators of the embodiment 1 are applied in a ladder type filter.

FIG. 5 shows a circuit diagram of a ladder type filter 61 employing this thin film bulk acoustic wave resonator 10.

As shown in the figure, the ladder type filter formed by connecting a plurality of the thin film bulk acoustic wave resonators 10 together in series and in parallel can be utilized as an RF filter of mobile communication apparatus.

Figure 6:
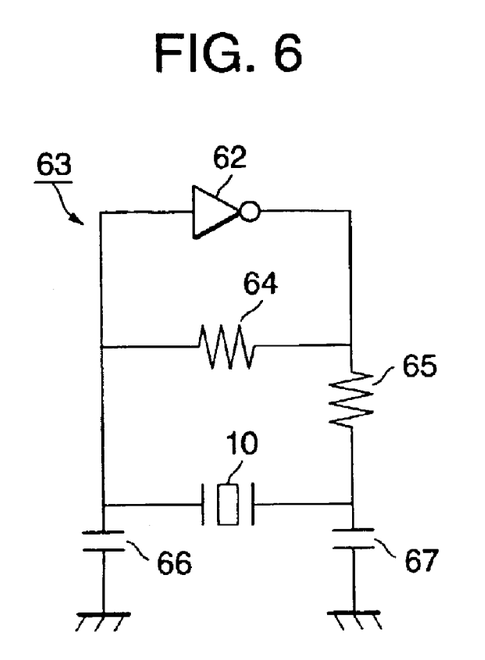
FIG. 6 is a circuit diagram where the thin film bulk acoustic wave resonators of the embodiment 1 are applied in an oscillator.

FIG. 6 shows a circuit diagram of a voltage control resonator 63 employing the thin film bulk acoustic wave resonator.

As shown in the figure, by connecting the thin film bulk acoustic wave resonator 10, a feedback resistor 64, a dumping resistor 65, load capacitors 66, 67 and a CMOS inverter amplifier 62 all together, it can be utilized as a voltage controlled oscillator of the mobile communication apparatus.

(Embodiment 2)

Next, the thin film bulk acoustic wave resonator relating to the embodiment 2 of the invention will be explained.

In this embodiment, a single crystal silicon substrate with (100) face is used as the substrate 11 having the internal cavity 13 shown in FIG. 2; an epitaxial film of Pt oriented to (100) orientation in the direction of the thickness is used as the first electrode film 16; and an epitaxial film of BaTiO3 oriented to (001) orientation in the direction of the thickness is used as the piezoelectric film 17. Other structures and processes are the same as those of the embodiment 1.

By measuring the frequency characteristics of the thin film bulk acoustic wave resonator fabricated as mentioned above, this thin film bulk acoustic wave resonator had excellent characteristics: i.e. the resonant frequency was 2.2 GHz; the electromechanical coupling coefficient was 13%; and the quality coefficient Q was 1200. When the piezoelectric film is constructed with ferroelectric material, the resonant frequency of the resonator is changed by applying a voltage of e.g. direct current between the two electrode films. If ferroelectric material of perovskite crystal system such as BaTiO3 was used as the piezoelectric film in the structure of this embodiment, the resonant frequency was changed from 2.195 GHz to 2.205 GHz when a direct current voltage of 0.2 to 3.0 V was applied between the electrode nodes 16a and 18a, and the changing rate thereof was 0.5%.

(Embodiment 3)

The thin film bulk acoustic wave resonator relating to the embodiment 3 of the invention will be explained hereinafter.

In this embodiment, an alkali-less glass substrate was used as the substrate 11 having the internal cavity 13 shown in FIG. 2; an orientation film of Al oriented to (111) orientation in the direction of the thickness was used as the first electrode film 16; and an orientation film of AlN oriented to (0001) orientation in the direction of the thickness was used as the piezoelectric film 17. Other structures and processes are the same as those of the embodiment 1.

In the case of a glass substrate, a cavity and a glass layer can be formed therein by carrying out reflow in oxygen atmosphere at a temperature higher than the glass transition temperature. In this embodiment, the substrate 11 having the internal cavity 13 was formed by carrying out reflow treatment of 920 degrees Celsius for 10 minutes in oxygen atmosphere, with the alkali-less glass (Corning 1737).

Besides, the Al electrode oriented to (111) orientation in the direction of the thickness thereof and the AlN piezoelectric film oriented to (0001) orientation in the direction of the thickness thereof suitable for the thin film bulk acoustic wave resonator can be formed on the glass substrate by sputter deposition method at the substrate temperature of the room temperature to approximately 300 degrees Celsius.

By measuring the frequency characteristics of the thin film bulk acoustic wave resonator fabricated as mentioned above, this thin film bulk acoustic wave resonator had excellent characteristics: i.e. the resonant frequency was 2.8 GHz; the electromechanical coupling coefficient was 6%; and the quality coefficient Q was 1700.

(Embodiment 4)

The thin film bulk acoustic wave resonator relating to the embodiment 4 of the invention will be hereinafter explained with the aid of FIG. 7.

This embodiment is a thin film bulk acoustic wave resonator having three kinds of resonant frequencies, wherein the thin wall of the major surface of the substrate over the internal cavity is formed with 3 different kinds of thickness. This device was formed by a single process.

Figure 7A:
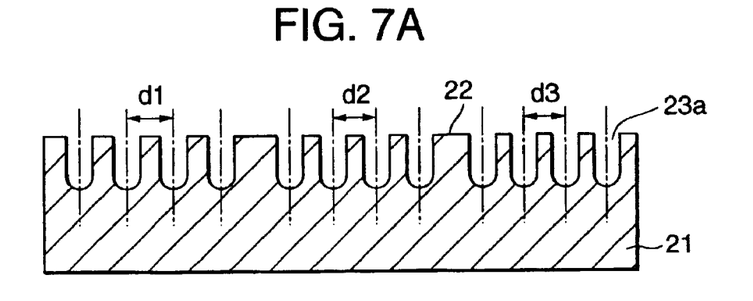
FIGS. 7A to 7C are cross sections explaining the embodiment 4.

First of all, as shown in FIG. 7A, cylindrical trenches 23a of 0.3 μm in diameter are patterned on a major surface 22 of an insulative single crystal silicon substrate 21 with 3 kinds of intervals, i.e. d1=1.00 μm, d2=1.05 μm, and d3=1.10 μm.

Figure 7B:
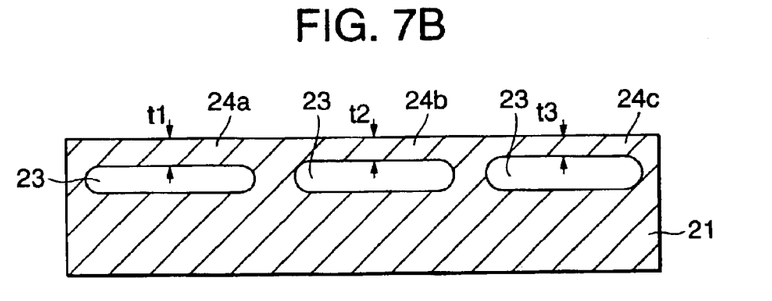

Then, as shown in FIG. 7B, annealing of 1100 degrees Celsius for 5 minutes in hydrogen was carried out to form thin walls 24a, 24b and 24c of single crystal silicon having 3 kinds of different thickness, i.e. t1=0.60 μm, t2=0.55 μm and t3=0.50 μm corresponding to trench intervals d1, d2 and d3 respectively on respective cavities 23.

Figure 7C:
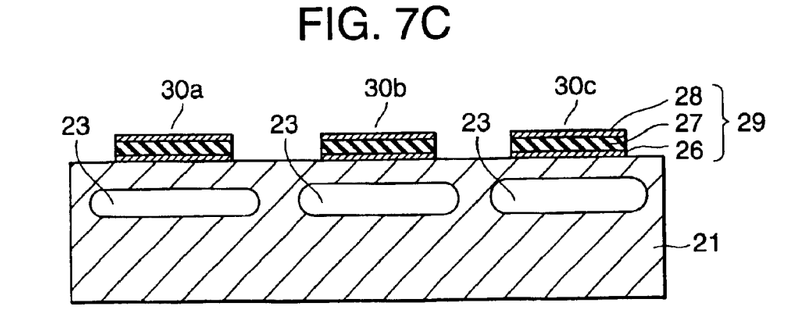

Subsequently, as shown in FIG. 7C, a first electrode film 26 of iridium film oriented to (111) orientation in the direction of the thickness, a piezoelectric film 27 of AlN film oriented to (0001) orientation in the direction of the thickness, and a second electrode film 28 are deposited to form a layered member 29, as is the case of the embodiment 1.

By measuring the frequency characteristics of the thin film bulk acoustic wave resonator fabricated as mentioned above, this thin film bulk acoustic wave resonator had excellent characteristics: i.e. different resonant frequencies of 2.51 GHz for the resonator 30a, 2.41 GHz for the resonator 30b and 2.31 GHz for the resonator 30c in order starting from the left side of FIG. 7C were obtained; the electromechanical coupling coefficient and the quality coefficient Q were 5.5% and 1400 respectively, common to all resonators.

(Embodiment 5)

A voltage controlled oscillator with different oscillation frequencies, employing a plurality of thin film bulk acoustic wave resonators with different resonant frequencies relating to the embodiment 5 of the invention, will be explained hereinafter.

Figure 8:
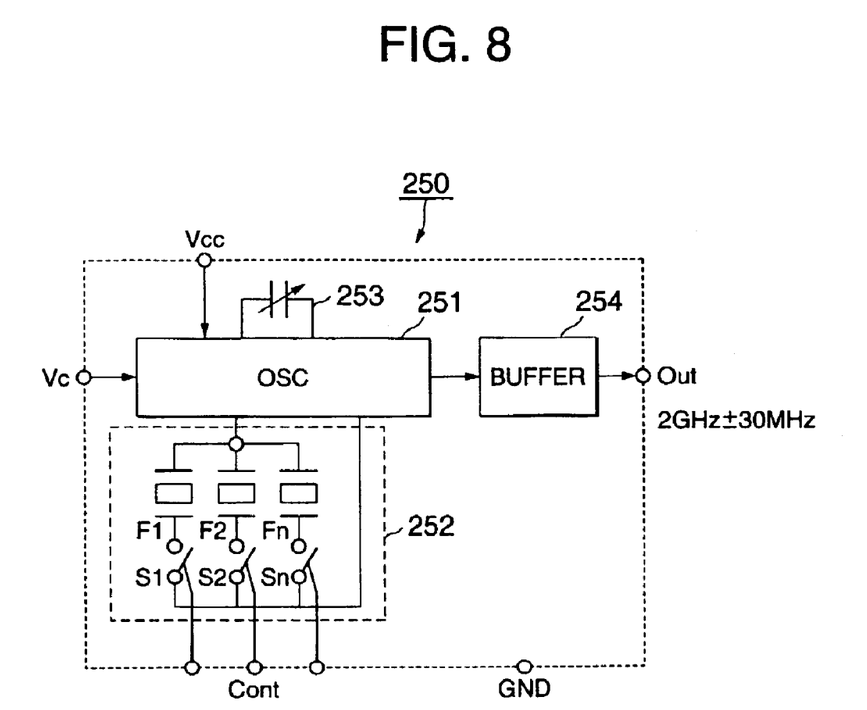
FIG. 8 is a circuit diagram of the voltage control oscillator of the embodiment 5.

FIG. 8 is a block circuit diagram of the voltage controlled oscillator in this embodiment.

A source voltage Vcc and a control voltage Vc are applied to this voltage controlled oscillator 250, which has a terminal Cont for frequency change controlling, a ground terminal GND and an output terminal Out, as shown in the figure.

Furthermore, the voltage controlled oscillator 250 contains an oscillation circuit 251 represented by Colpitts oscillation circuit, a variable capacitor 253 connected thereto, and an output buffer 254 connected to the oscillation circuit 251. Moreover, the voltage controlled oscillator 250 comprises a plurality of thin film bulk acoustic wave resonators F1 to Fn having different resonant frequencies and a thin film bulk acoustic wave resonator selecting circuit 252 connected thereto including switches S1 to Sn for switching.

A plurality of the thin film bulk acoustic wave resonators F1 to Fn having different resonant frequencies were formed on the same substrate as is explained in the embodiment 4.

By using such voltage controlled oscillator 250, different oscillation frequencies e.g. 2 GHz±30 MHz corresponding to the resonant frequencies of the respective thin film bulk acoustic wave resonators F1 to Fn could be realized by selecting the switches S1 to Sn in accordance with the selection digital signal and the control voltage Vc fed to the control terminal Cont.

(Embodiment 6)

A device in which the thin film bulk acoustic wave resonator relating to the embodiment 6 of the invention is packaged on a circuit board will be explained hereinafter.

FIG. 9 shows cross sections at each main step for the packaged thin film bulk acoustic wave resonator.

Figure 9A:
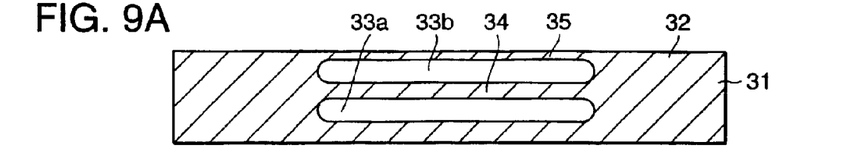
FIGS. 9A to 9F are cross sections explaining the embodiment 6.

As shown in FIG. 9A, an insulative single crystal silicon substrate 31 comprising two plate-like internal cavities 33a, 33b, an internal single crystal silicon thin wall 34 of 0.8 µm in thickness interposed between the two internal cavities 33a, 33b, and a single crystal silicon thin wall 35 of 0.8 µm in thickness on the surface region, formed by the embodiment 1, are prepared first. The surface of the single crystal silicon substrate 31, i.e. one major surface 32 possesses (111) face.

Figure 9B:
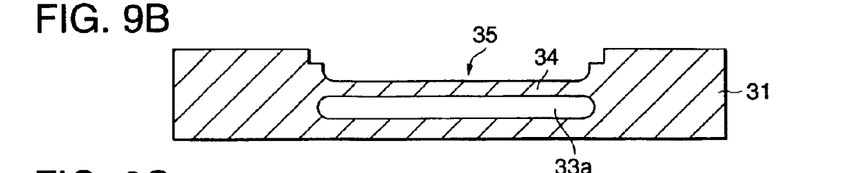

Then, as shown in FIG. 9B, the thin wall 35 of the surface side is removed by patterning so as to expose the internal thin wall 34.

Figure 9C:
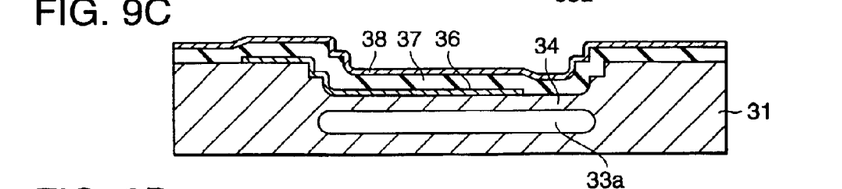

Subsequently, as shown in FIG. 9C, the TiN barrier layer (not shown) is formed at 600 degrees Celsius of the substrate temperature by RF magnetron sputter method. Then, after the iridium film oriented to (111) orientation in the direction of the thickness thereof is deposited by epitaxial growth, a first electrode film 36 is formed by patterning it with the aid of lithography and reactive ion etching (RIE).

Additionally, the piezoelectric film of AlN film of 0.6 µm in thickness oriented to (0001) orientation in the direction of the thickness thereof is deposited by epitaxial growth at 600 degrees Celsius of the surface temperature with the aid of RF magnetron sputter method. Then, a second electrode film 38 of Pt of 100 nm in thickness is grown.

Figure 9D:
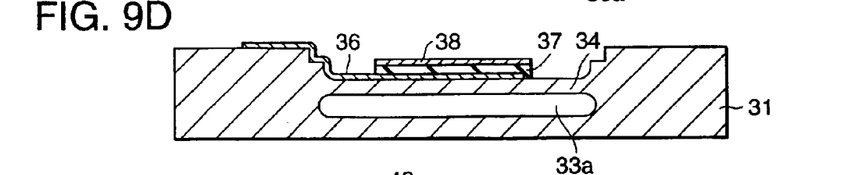

Subsequently, the patterned second electrode film 38 and the piezoelectric film 37 are formed by lithography and reactive ion etching (RIE), as shown in FIG. 9D.

Figure 9E:
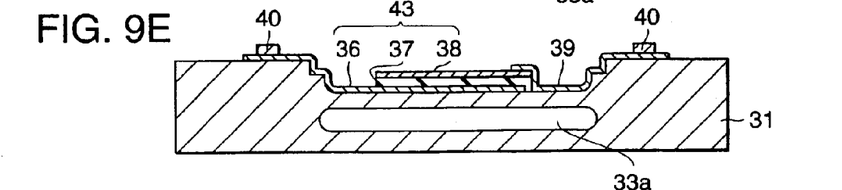

Then, as shown in FIG. 9E, wiring is led to the outside through an internal wiring 39 out of the second electrode film 38. Then solder bumps 40 are formed on the elongated portion 36a of the first electrode film 36 and the internal wiring 39.

Figure 9F:
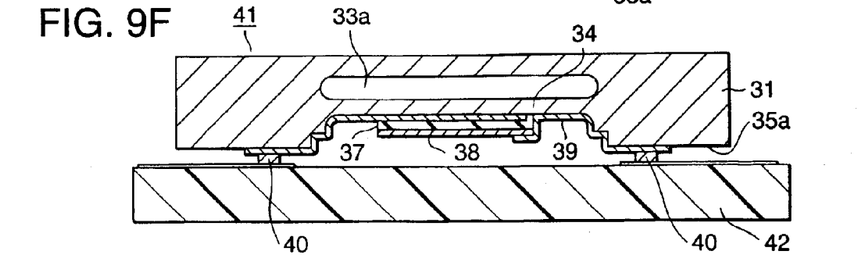

In the next place, as shown in FIG. 9F, after the rear surface of the silicon substrate 31 was polished to make it thin, the thin film bulk acoustic wave resonator 41 was formed by being separated with the aid of dicing. Finally, the thin film bulk acoustic wave resonator 41 is mounted on a board 42 by reflow. By making the layered member 43 thinner than the recessed portion 35, facedown bonding can be carried out because the layered member becomes lower than the top portion 35a of the major surface of the substrate, so that connection to the wiring becomes easy.

Thus the device in which the internal cavities are formed over and under the resonant portion of the thin film bulk acoustic wave resonator can be realized by simple processes.

The present invention can form the thin film bulk acoustic wave resonator without selective ion etching etc., and especially a plurality of the thin film bulk acoustic wave resonators with different frequencies can be formed on one substrate by the same process.

What is claimed is:

1. A thin film bulk acoustic wave resonator comprising:
   a silicon substrate having a major surface including a recessed surface and an internal cavity formed adjacent to the recessed surface of the major surface, a thin wall of silicon surrounding a part of the internal cavity and located between the internal cavity and the recessed surface; and
   a layered structure including a first, a piezoelectric film, and a second electrode film formed on the recessed surface at a position lower than a top surface of the major surface, a thickness of the layered structure being equal to or smaller than 10 µm. and the first electrode film and the piezoelectric film being epitaxial growth films.

2. The thin film bulk acoustic wave resonator as stated in claim 1, wherein a TiN buffer layer is formed between the substrate and the epitaxial growth films.

3. A thin film bulk acoustic wave resonator comprising:
   a substrate of semiconductor or insulator having a plurality of internal cavities formed along one major surface, and thin walls located between the major surface and the respective internal cavities, wherein thickness of at least one of the thin walls is different from thickness of the other walls; and
   resonators having layered resonant films, each of which comprises a first electrode film, a piezoelectric film and a second electrode film, deposited on the respective thin walls, constructing the resonators in cooperation with the thin walls, wherein a zone of resonant frequency varies in accordance with the thickness of the thin walls.

4. The thin film bulk acoustic wave resonator as stated in claim 3, wherein the substrate is a silicon substrate.

5. The thin film bulk acoustic wave resonator as stated in claim 3, wherein the substrate is a glass substrate.

6. The thin film bulk acoustic wave resonator as stated in claim 3, wherein the substrate is a silicon substrate, and the first electrode film and the piezoelectric film are epitaxial growth films.

7. The thin film bulk acoustic wave resonator as stated in claim 6, wherein a TiN buffer layer is formed between the substrate and the epitaxial growth films.

8. The thin film bulk acoustic wave resonator as stated in claim 3, wherein thickness of the thin wall is equal to or smaller than 10 µm.

9. The thin film bulk acoustic wave resonator as stated in claim 8, wherein thickness of the layered resonant film comprising the first electrode film, the piezoelectric film and the second electrode film is equal to or smaller than 10 µm.

* * * * *